United States Patent [19]

Heist et al.

[11] Patent Number: 4,632,382
[45] Date of Patent: Dec. 30, 1986

[54] ROLLER ENGAGING AND DISENGAGING DEVICE

[75] Inventors: Hans Heist, Weisbaden; Dieter Toepfer, Heidenrod; Sylvia Britzke, Wiesbaden; Eberhard Schoernig, Taunusstein, all of Fed. Rep. of Germany

[73] Assignee: Hoechst Aktiengesellschaft, Frankfurt am Main, Fed. Rep. of Germany

[21] Appl. No.: 784,538

[22] Filed: Oct. 4, 1985

[30] Foreign Application Priority Data

Oct. 9, 1984 [DE] Fed. Rep. of Germany ....... 3436980
Aug. 28, 1985 [DE] Fed. Rep. of Germany ....... 3530680

[51] Int. Cl.$^4$ ............................ B65H 5/06; B30B 3/04
[52] U.S. Cl. ...................................... 271/273; 100/168
[58] Field of Search ............... 271/273, 271, 274, 277; 100/168, 169, 170, 171, 176; 198/624

[56] References Cited

U.S. PATENT DOCUMENTS

| 1,925,972 | 9/1933 | Standley et al. .................... 100/168 |
| 2,965,374 | 12/1960 | Streeter ........................... 198/624 X |
| 4,126,391 | 11/1978 | Nishimoto ......................... 355/27 |
| 4,206,527 | 6/1980 | Diels et al. ........................ 15/102 |

FOREIGN PATENT DOCUMENTS

2326122 12/1973 Fed. Rep. of Germany .
343963 2/1931 United Kingdom .
1067550 5/1967 United Kingdom .
2108706 5/1983 United Kingdom .

Primary Examiner—Douglas C. Butler
Assistant Examiner—L. J. Goffney
Attorney, Agent, or Firm—Schwartz, Jeffery, Schwaab, Mack, Blumenthal & Evans

[57] ABSTRACT

A device 1 for engaging and disengaging rollers rollers 14, 15, which are arranged horizontally in pairs, with the shaft ends 18 of the upper rollers being provided with ball bearings 6 which can be lifted and lowered and are guided in bracket-type guides 7. The webs 3, 4 of U-shaped slide members 17 are guided in friction bearings 2, and said slide members can be shifted to and fro by a shifting path X. The webs 3, 4 are provided with recesses 9, 10, each of which possesses a bevelled edge 5a, 5b. The ball bearings 6 roll along the bevelled edges such that in the engaged position the ball bearings are pressed down in the guides 7 by the upper edges 5b, and in the disengaged position they are raised by the lower edges 5a. The recesses 9 provided in the lower web are staggered with respect to the recesses 10 provided in the upper web 4 by the shifting path X. Each slide member 17 is equipped with a gear rack 11 engaged by a gear wheel segment 12, which by use of a swivelling lever 16 can be swivelled about a shaft 13 supported in the side plate 20. The lower rollers 14 are stationarily supported in the side plates 20.

22 Claims, 9 Drawing Figures

ROLLER ENGAGING AND DISENGAGING DEVICE

BACKGROUND OF THE INVENTION

The present invention relates to a device for engaging and disengaging rollers, comprising pairs of upper and lower horizontal rollers. The rollers convey sheet-like materials and squeeze off any residual liquid adhering to the sheet-like materials. A bearing which can be raised and lowered with respect to the lower roller, is provided at the axial ends of each upper roller.

A device of this kind has been disclosed by German Offenlegungsschrift No. 2,326,122, in which each shaft journal of a pair of upper and lower rollers extends into a housing on each side. In this arrangement, the lower bearing is fixed, whereas the upper bearing is free to pivot on a pin arranged eccentrically relative to the axis of the upper bearing. The side of the bearing opposite to the pin is connected with a joint. The joint, in turn, is hinged to the lower end of a lever which is adapted to swivel about a horizontal pin mounted in a bracket attached to the upper wall of the housing. An actuating handle projecting from the top of the housing is connected with the swivelling lever. The lever and the joint constitute a toggle lever arrangement which forces the upper rollers against the lower rollers when the arrangement is in the extended position, and which raises the upper rollers from the lower rollers when the actuating handle is shifted. A relief spring ensures that the upper rollers are arrested in the raised position.

Each end of each upper roller is provided with a separate actuating lever. It is therefore necessary, using this device, to actuate quite a number of handles to raise the upper rollers. Raising the rollers is required prior to any prolonged standstill, for example, overnight or for the weekend, in order to prevent the upper rollers from sticking to the lower rollers. This is a time-consuming operation, so that the operator is tempted to omit it at times. If, however, the rollers are left pressed together, the rollers may stick together, as described above, and, moreover, deformations of their surfaces may occur. Such deformations may jeopardize a safe and gentle transport of the sheet-like materials, in particular of printing plates, and a complete squeezing off of liquid from the sheet-like materials particularly in horizontal processing equipment.

In order to facilitate the operation of a developing device for printing plates, European Pat. No. 0,004,337 (equivalent to U.S. Pat. No. 4,206,527) proposes a device, in which a pivoting fork head having an upper and a lower arm is provided for engaging the bearings of the upper rollers. The pivoting axis of the fork head extends parallel to the direction of transport of the printing plates. The bearings are actuated via a toggle lever arrangement, whereby the upper arm of the pivoting fork head exerts pressure on the top of the bearing when the bearing is in a lowered position, and the lower arm of the fork head supports the bearing in a raised position. A first end of each toggle lever arrangement is connected with the fork head. A second end of each toggle lever arrangement is connected with a rotatable control shaft which is common to all toggle lever arrangements, and supported parallel to the direction of transport of the printing plates. It is true that in employing this device it is possible to raise and to lower all upper rollers by one single lever actuation, but the construction of the toggle lever arrangement and the forked heads equipped with two arms is complicated and expensive.

There has also been disclosed an apparatus for developing printing plates, which comprises rollers which are arranged in pairs and the ends of which are supported in side plates. These side plates are divided into upper and lower parts, and the upper part of each side plate is pivoted and equipped with the corresponding lifting elements in such a manner that the complete upper parts of the side plates or the upper part of the processing station, respectively, may be lifted together with all upper rollers.

This latter apparatus is also comparatively expensive, particularly if the effort which must be exerted by the operator for the lifting operation is to be kept moderate. In addition, the above arrangement cannot be used in an installation including a number of component processing stations which may be assembled, in a modular manner, with other structural units to form the complete installation.

SUMMARY OF THE INVENTION

It is therefore an object of the present invention to develop and improve a device of the type described above in a way such that all upper rollers can be reliably raised from, and lowered onto, the lower rollers, employing inexpensive means of very simple design.

In accordance with the above object, there has been provided a device for engaging and disengaging horizontally-arranged pairs of rollers for transporting sheet-like materials in a transport direction, comprising: a plurality of first, horizontal, upper rollers having first and second axial ends; first and second bearings for rotatingly supporting each of the first and second axial ends; first and second side plates for supporting the plurality of first rollers; a plurality of second, horizontal, lower rollers rotatingly supported in the side plates, wherein the first rollers are arranged to move between a first position engaging the second rollers and a second position not engaging the second rollers; a vertical guide corresponding to each bearing for vertically guiding the bearing, and disposed in one of the side walls; first and second slide members corresponding to the first and second axial ends, wherein the slide members include an upper web, a lower web and a wall, wherein the slide members are slidably supported on the side walls; a lower recess disposed in the lower web corresponding to each of the first and second axial ends; an upper recess disposed in the upper web corresponding to each of the first and second axial ends, wherein each lower recess is separated from a corresponding lower recess by a first axial distance; means for sliding the sliding member between a third position wherein the bearings are disposed in the lower recesses and the first rollers are in the first position, and a fourth position wherein the bearings are disposed in the upper recesses and the first rollers are in the second position.

Preferably, the device further comprises a plurality of friction bearings attached to one of the first and second side plates for slidably containing said sliding members.

In a preferred embodiment, the lower recess comprises a first bevelled edge for facilitating a respective bearing to move from a lower recess to an upper recess.

Preferably, the means for sliding comprise a gear rack disposed on the upper web and at a first end of the sliding member, a gear wheel segment engaging the gear rack, a shaft for rotatingly supporting the gear wheel segment one of the first and second side plates, and a lever for turning the gear wheel segment.

Further objects, features and advantages of the present invention will become apparent from the detailed description of preferred embodiments which follows, when considered together with the attached figures of drawing.

DESCRIPTION OF THE PREFERRED EMBODIMENTS

The object of the invention is achieved by providing a device, in which the bearings, designed as ball bearings, are vertically guided in bracket-type guides stationarily mounted to the inner surfaces of side plates. Two upright, U-shaped slide members can be shifted to and fro by a predetermined distance. The slide members are guided on friction bearings and comprise a lower and an upper web and a wall that is adjacent to the respective side plate and is provided with slots through which the guides protrude into the interior of the device. The lower and the upper webs of each slide member are each provided with recesses; each of the recesses has one bevelled edge. The lower recesses are staggered relative to the upper recesses, by a predetermined distance.

The roller engaging and disengaging device is designed symmetrically with respect to its longitudinal axis, which extends perpendicularly to the roller axes. On each side of the device, there is provided a slide member which carries a gear rack. The gear rack is mounted, above the upper web, to an extension piece disposed at one end of the slide member. A gear wheel segment engages the gear rack and can be swiveled about a shaft supported in the side plate of the device.

In a preferred embodiment of the present invention, a swivelling lever is connected with the shaft of the gear wheel segment, and the swivelling motion of the swivelling lever is transformed into a translational motion of the slide member by meshing the gear wheel segment and the gear rack. The upper and the lower web of the slide member are each guided in a plurality of friction bearings made of a plastic material. The bearings are fastened to the inner surface of the respective side plate. The slide member is shifted to and fro, in the transport direction of the sheet-like materials, by the swivelably mounted gear wheel segment which engages the gear rack.

In a further embodiment of the invention, the bevelled edges of the lower recesses face away from the transport direction of the sheet-like materials. The bevelled edges of the upper recesses, however, face toward the transport direction. When the slide members are shifted, the bevelled edges act as inclined planes for the ball bearings. In the engaged position the ball bearings are pressed through the lower recesses by the bevelled edges of the recesses of the upper web and thus the upper rollers are pressed onto the lower rollers. In the disengaged position, the ball bearings are raised by the bevelled edges of the recesses of the lower web, so that the ball bearings freely project beyond the upper recesses, and the upper rollers are lifted off the lower ones.

The slide members are cost-effectively produced as punched and bent sheet metal parts.

The predetermined distance between the center lines of a lower recess and an associated upper recess corresponds to the shifting path of a slide member. Furthermore, the recesses, which all have the same size, are longer than are the external diameters of the ball bearings. The height of the wall of the slide member is less than the external diameter of the ball bearings. The ball bearings are appropriately seated on the shaft ends of the upper rollers and form the lateral ends of the latter.

In order to be able to simply and inexpensively adjust the pressure exerted by the rollers onto the plate being conveyed through the apparatus, preformed parts having a bevel are detachably fastened to the upper web. One preformed part is provided adjacent to each recess, and a plurality of intermediate sheets of defined thickness are provided between the underside of the upper web and the upper surface of each preformed part.

By using slide members produced from sheet material by punching and bending, the advantages of a simple constructional design, low production costs and low weight are achieved.

Figures 1, 1A:
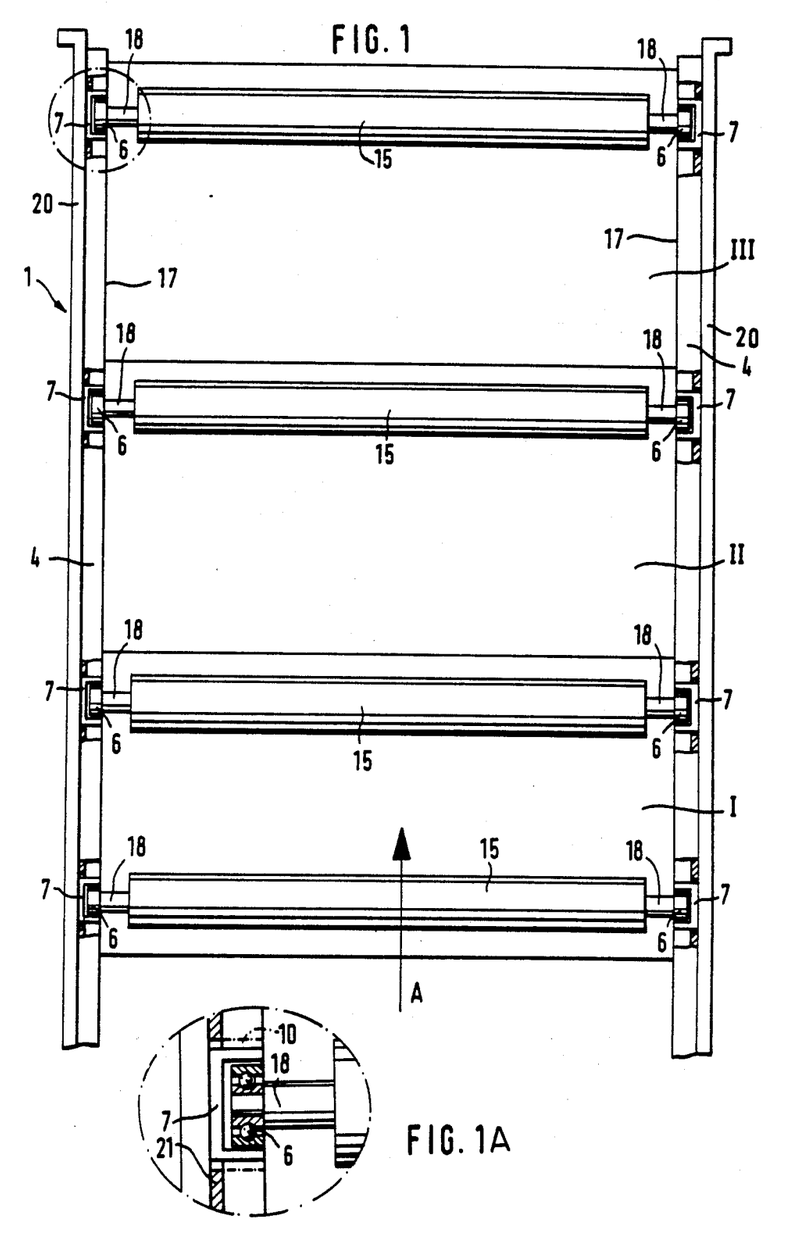
FIGS. 1 and 1A show a diagrammatic plan view of one embodiment of the device according to the invention.

The diagrammatic plan view of the device 1, according to FIG. 1, shows three modular processing stations I, II, III which are succesively arranged. Seen in the transport direction A, the stations comprise, a developing station, a rinsing station and a station for applying a protective coating to the developed and rinsed materials, particularly printing plates. For reasons of better clarity, all elements required to perform the treatments, such as spray tubes, brush rollers and doctor blades, have been omitted from FIG. 1, and only the pairs of rollers required for conveying the printing plates through device 1 and for squeezing any residual liquid off the printing plates are shown.

In the plan view, only the upper rollers 15 of these rollers pairs can be seen. The right and left ends of the rollers 15 are each supported in a slide member 17 by means of a ball bearing 6. The slide member 17 can be shifted to and fro with respect to side plates 20 of the device 1 in the transport direction A, as will be described in detail below.

Each U-shaped slide member 17 comprises upright upper and lower webs, which are flexed away from a wall 21 of the slide member, such that the webs are directed to the interior of the device 1. The plan view of FIG. 1 shows the upper web 4 which in the region of each ball bearing 6, seated on the shaft ends of the rollers 15, is provided with an upper recess 10. Furthermore, each ball bearing 6 is guided in a bracket-type guide 7, and in a plane perpendicular to the projection plane. The bracket-type guides 7 are fastened to the inner sides of the side plates 20 of the device 1.

The enlarged detail view in FIG. 1 shows a slotted upper web 4 in the area of the recess 10, and the wall 21 of the slide member 17. The device 1 is designed symmetrically, i.e., the right and left sides each have a substantially identical slide member 17.

Figure 2:
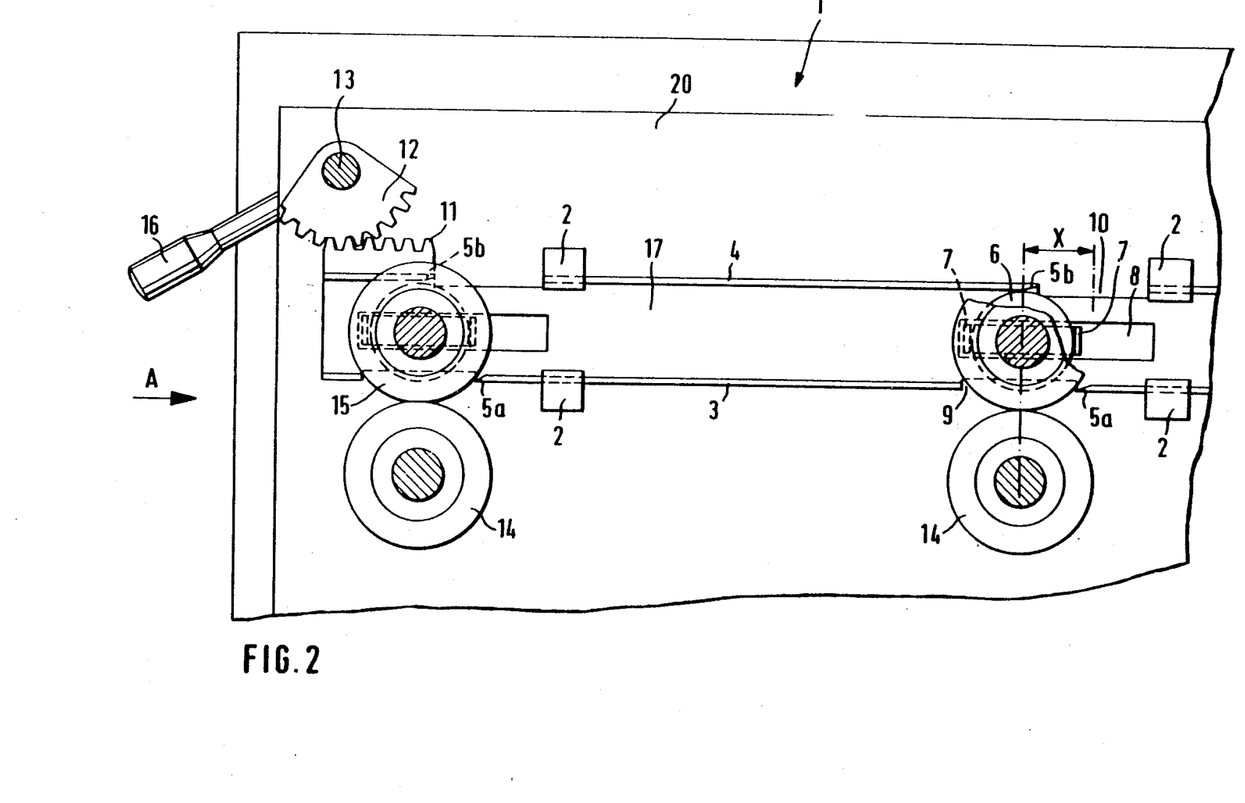
FIG. 2 shows a selective view of the device of FIG. 1, comprising two pairs of rollers in the engaged position.

FIG. 2 diagrammatically shows the engaged position of the pairs of rollers in which the upper rollers 15 are pressed against the respective associated lower rollers 14. The upper and the lower web 4 and 3 are each guided in a plurality of friction bearings 2, which are preferably plastic bearings. The friction bearings 2 are mounted to the inner surface of their associated side plate 20. The wall 21 of the slide member 17 is provided with slots 8 through which the bracket-type guides 7 protrude into the interior of the device 1.

The slots 8 have the shape of an oblong rectangle. The length of the long side of the slots 8 at least corresponds to the sum of the external diameter of a ball bearing 6, the thickness of the two lateral parts of the bracket-type guide which project through the slots 8 to the inside, and a shifting path X of the slide member 17.

The shifting path X of a slide member 17 corresponds to a predetermined distance X which is equal to the distance between the center line of a lower recess 9 in the lower web 3 and the center line of an associated recess 10 in the upper web 4 of the slide member 17. The upper and lower recesses 9 and 10 have the same lengths, and are longer than the external diameter of the ball bearings 6.

The height H (FIG. 3) of the wall 21 of the slide member 17 is less than the external diameter of the ball bearings 6, the bearings are seated on the shaft ends 18 of the upper rollers 15 and form the lateral ends of the rollers.

The slide members 17 are punched from sheet metal and bent. The slots 8 in the wall 21 and the lower and upper recesses 9, 10 in the lower and upper webs 3 and 4, are produced in one work cycle. Then the slide member 17 is bent into the U-shaped member comprising the wall 21 and the two webs 3 and 4.

The lower and upper recesses 9, 10 each have a bevelled edge 5a, 5b. The bevelled edges 5a of the lower recesses 9 point opposite the transport direction A of the printing plates, and the bevelled edges 5b of the upper recesses 10 point in the transport direction A.

Each slide member 17 is provided with a gear rack 11 arranged above the upper web 4 at one end of the slide member 17 and extending in a direction parallel to the transport direction A. A gear wheel segment 12 engages the gear rack 11 and can be swiveled about a shaft 13 supported in the side plate 20. Swivelling is effected by means of a swivelling lever 16 which is connected with the shaft 13 of the gear wheel segment 12. By the meshing of the gear wheel segment and the gear rack, the swivelling motion of the swivelling lever 16 is converted into a translational motion of the slide member 17.

In FIG. 2, the swivelling lever 16 is in its lower position, corresponding to the engaged position of the roller pairs. The ball bearings 6 are pressed through the lower recesses 9 by the bevelled edges 5b of the recesses 10 provided in the upper web 4, so that the upper rollers 15 are pressed onto the lower rollers. The bracket-type guides 7, in which the ball bearings are guided, ensure that the ball bearings can only be lowered vertically, but cannot swing laterally. When the slide members 17 are shifted, the slopes of the upper edges 5b form inclined planes for the ball bearings 6. The outer rings of the ball bearings 6 roll along these inclined planes, and the ball bearings 6 are pressed down.

Figure 3:
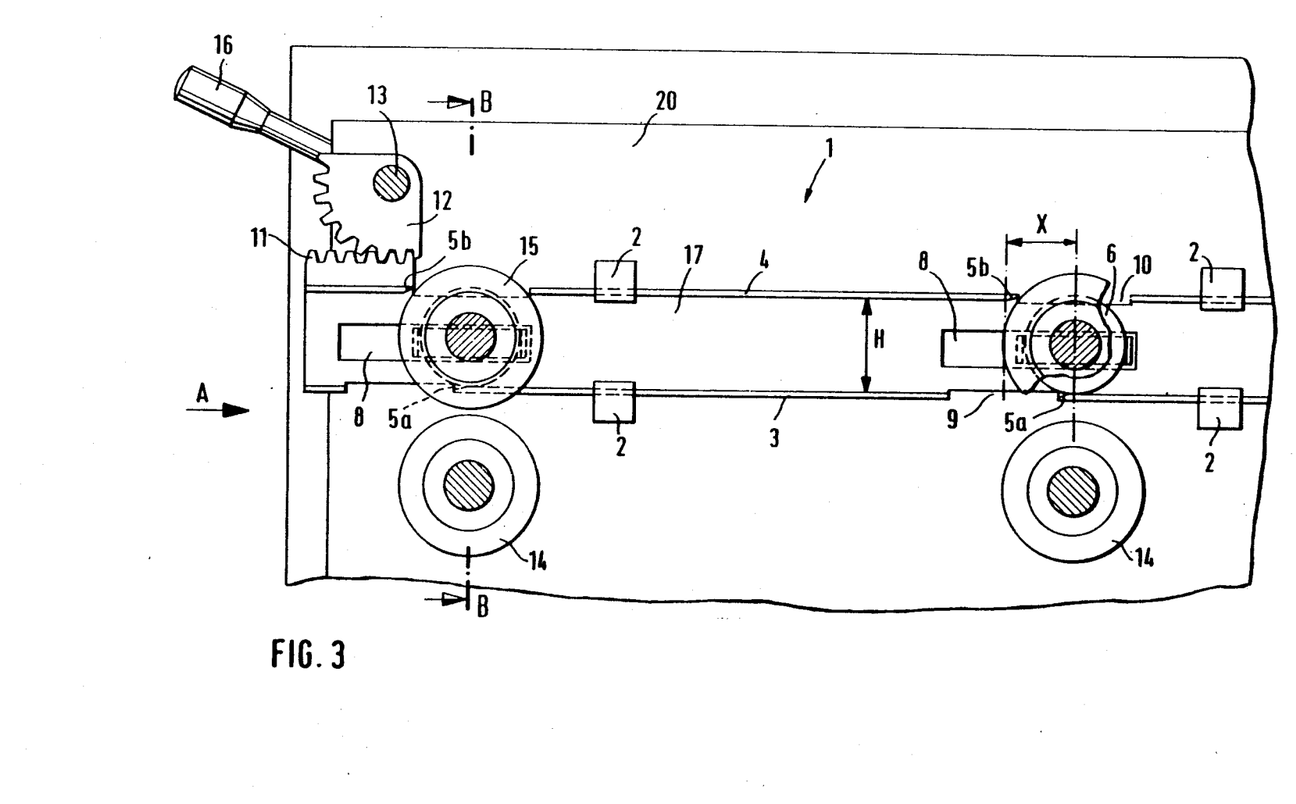
FIG. 3 shows a view as shown in FIG. 2, wherein the two pairs of rollers are in the disengaged position.

FIG. 3 shows a diagrammatic view of the disengaged position of the pairs of rollers or of the slide member 17, respectively. Identical component parts shown in FIGS. 2 and 3 bear the same reference numerals, and the parts already described with reference to FIG. 2 are not again described.

In the disengaged position, the swivelling lever 16 is swivelled to its upper position where the gear wheel segment 12 engages the right end of the gear rack. During the lifting step, the slide member is shifted to the left, i.e., in a direction opposite the transport direction A, by the shifting path X. The ball bearings 6 roll upwards on the slopes of the lower edges 5a of the recesses 9 in the lower web 3 and are lifted in the bracket-type guides 7. The upper rollers 15 are thus lifted off the lower rollers 14. In the disengaged position there is no contact between the upper bevelled edges 5b of the recesses 10 provided in the upper web 4 and the associated ball bearings 6 which freely project through, or into, the upper recesses 10.

In this way, the ball bearings 6 of the upper rollers 15 can be lifted by a single swivelling motion of the swivelling levers 16 of the slide members 17. Lifting and lowering of the upper rollers can thus be effected in a very simple manner. The slide members 17 ensure that none of the ball bearings installed on either side of the upper rollers is inadvertently left in the engaged position. In the disengaged position, the upper rollers 15 can easily be removed from the device 1, cleaned and reinserted. After removal of the upper rollers 15, the lower rollers 14 which are stationarily mounted in the side plates 20 are easily accessible. Maintenance and cleaning can thus be performed without difficulty.

During operation, the upper and lower rollers are pressed together with a pressure selected appropriately for conveying the printing plates and squeezing off any residual liquid adhering to the plates. During prolonged standstills, for example, overnight or for the weekend, the upper rollers are moved to the disengaged position. Deformations or sticking-together of the rollers, due to residual liquids such as finishing agents still adhering to the rollers which might cause damage to the rubber coating are avoided.

Figure 4:
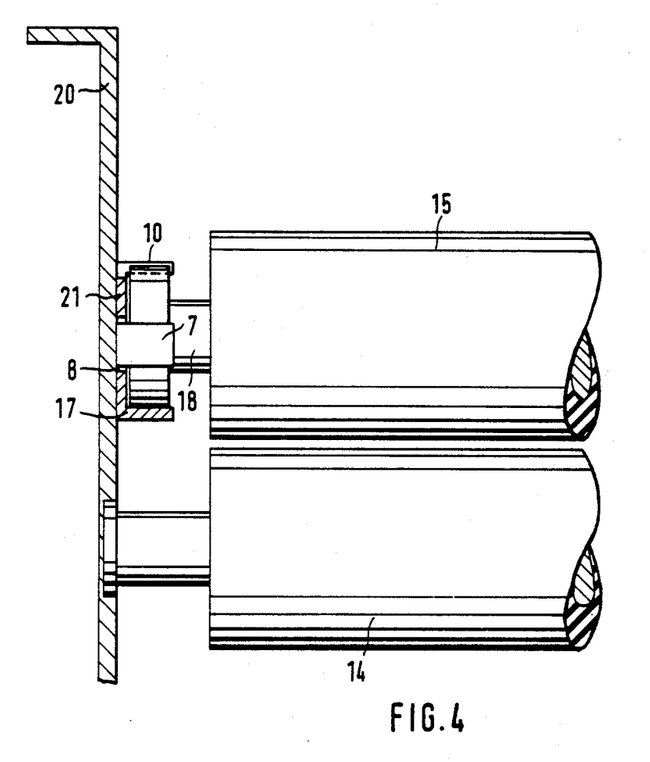
FIG. 4 shows a partial sectional view along line B—B shown in FIG. 3.

FIG. 4 shows a partial sectional view taken along line B—B indicated in FIG. 3. The upper roller 15 is raised from the lower roller 14. The ball bearing 6 is seated on the shaft end 18 of the upper roller 15; the upper part of the outer circumference of the ball bearing projects into the upper recess 10 of the slide member 17, while the lower part of the outer circumference of the ball bearing 6 does not project into the lower recess 9. The bracket-type guide 7 of the ball bearing 6 encloses the outer diameter of the ball bearing 6 approximately on the plane of the center line of the upper roller 15. The guide 7 protrudes through the slot 8 provided in the wall 21 of the slide member 17 and is fastened to the inside of the side plate 20. FIG. 4 also shows that the lower roller is stationarily fastened to the side plate 20. FIG. 4 only shows a sectional view of the left-hand part of the device 1; the right-hand part adjoining this part is of identical design.

In the embodiment according to FIGS. 1 to 4, the upper rollers are pressed onto or, depending on their respective position, lifted from the lower rollers by the axial displacement of the two slide members. The slide members are guided in friction bearings and have the shape of an upright U formed by the upper and the lower web. Recesses with bevelled edges are provided in the slide members.

It is required of printing plate developing apparatuses that it be possible to select the contact pressure between the upper and the lower rollers or between the upper rollers and a printing plate being conveyed through the roller pairs respectively. This makes it possible, for example, to control the layer weight of a finishing solution applied to the printing plate. If the amount of finishing solution applied is too low, this leads to scumming of the plate when in the printing press.

Figure 5:
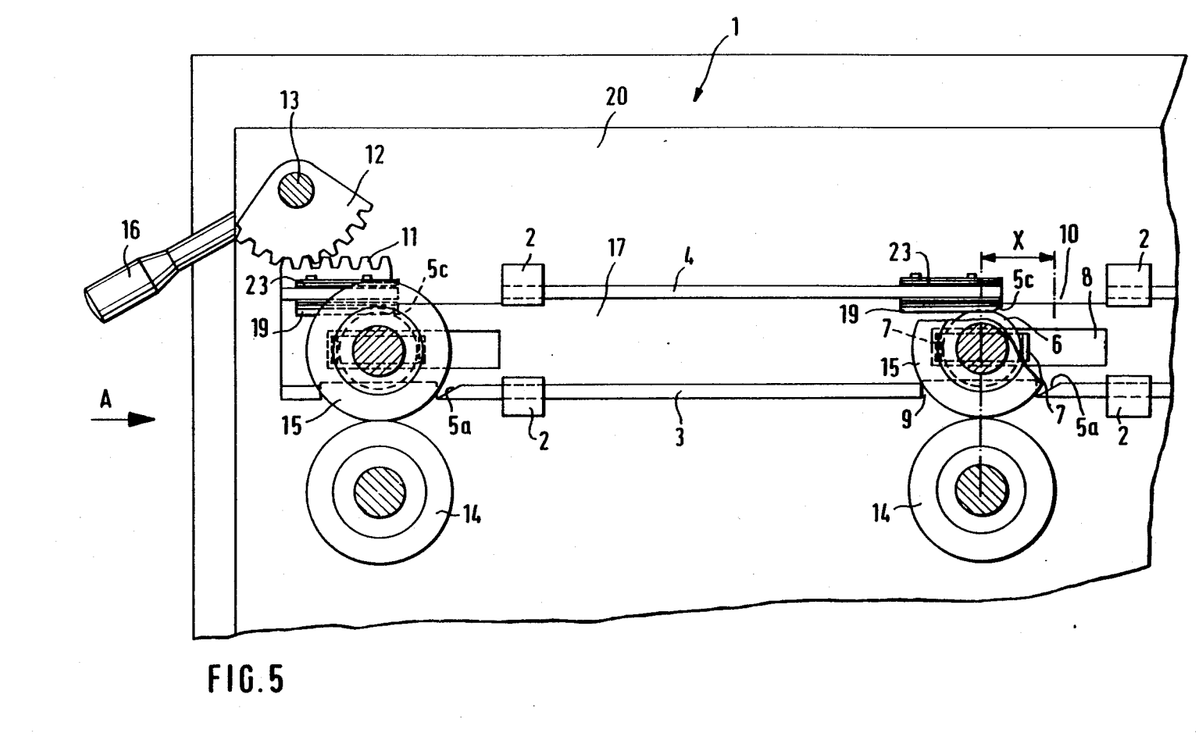
FIG. 5 shows a selective view, comprising two pairs of rollers, of another embodiment of the device, similar to that shown in FIG. 2, in the engaged position of the two pairs of rollers.
Figure 6A:
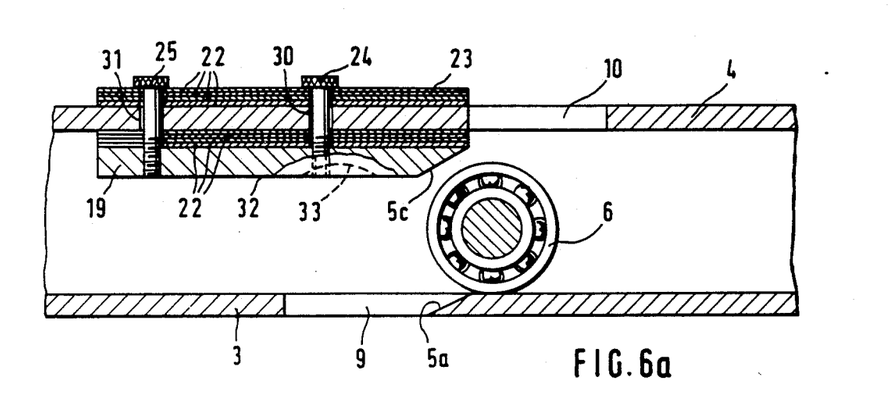
FIGS. 6a, 6b, and 6c show enlarged partial sectional views of a preformed part and intermediate sheets as shown in FIG. 5, and plan views of a preformed part and an intermediate sheet, respectively.

In a further embodiment of the device according to this invention, shown in FIGS. 5 and 6a, there have therefore been provided intermediate sheets 22, which are adjacent to each recess 10 of the upper web 4 and by means of which the rollers' contact pressure can be adjusted. The intermediate sheets 22 are arranged between the underside of the upper web 4 and the upper side of an associated preformed part 19 which is provided with a bevel 5c.

The lower recess 9 has a bevelled edge 5a. The bevelled edges 5a of all lower recesses 9 face opposite the transport direction A in which the printing plates are conveyed. The bevels 5c of the preformed parts 19 face the transport direction A.

When the slide members 17 are axially shifted, the preformed parts 19 will, using their bevels 5c and undersides 32 as contact surfaces, exert pressure onto the ball bearings. The pressure depends on the number of inserted intermediate sheets 22, and will thus determine the pressure exerted onto the printing plate by the upper rollers 15.

In general, the total number of intermediate sheets 22 will be somewhat greater than would be necessary to exert the required maximum pressure, so that shifting of the slide members into the pressure position at maximum contact pressure is only possible after reducing the number of intermediate sheets 22. This makes sure that excessive pressure, arising as a result of too many intermediate sheets, is avoided, which would cause damage to the developing apparatus.

The intermediate sheets 22 can have different thicknesses of between 0.05 and 1.0 mm but preferably the intermediate sheets 22 have a uniform thickness of 0.1 mm each. Each intermediate sheet is preferably provided with a stamped mark indicating its thickness in ciphers and units of measure. The contact pressure desired in each case can thus be set in a simple manner by selecting an appropriate number of intermediate sheets 22. The appropriate total thickness of the intermediate sheets 22 to be inserted between the preformed part 19 and the upper web 4, can be determined without having to use measuring instruments or special tools. The way of adjusting the contact pressure will be described in greater detail below.

On the upper surface of the upper web 4, there is provided a stock 23 of intermediate sheets 22, which is located opposite the associated preformed part 19. The intermediate sheets 22 of each stock 23 and the intermediate sheets 22 inserted between each preformed part 19 and the upper web 4 are connected with the respective associated preformed part 19.

A suitable material for the intermediate sheets 22 is, for example, stainless steel.

If the upper rollers are stationarily mounted, it is also possible to arrange the intermediate sheets and the preformed parts in the area of the lower rollers. In that case, the lower rollers are pressed against the upper rollers at a defined pressure.

The engaging and disengaging of the roller pairs is performed in a manner analogous to that described above with reference to FIGS. 2 and 3.

Figure 6B:
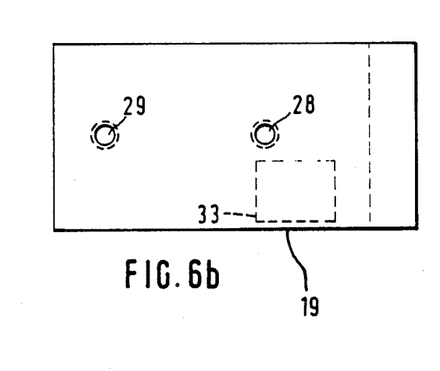

FIG. 6a shows an enlarged partial sectional view of the preformed part 19, of the stock 23 of intermediate sheets 22, and of the intermediate sheets 22 inserted between the preformed part 19 and the underside of the web 4. The preformed part 19 is provided with two tapped holes 28, 29, as illustrated in FIG. 6b. Two knurled-head screws 24, 25, which cross holes 26, 27 of the intermediate sheets 22 and holes 30, 31 of the upper web 4, are screwed into these internal taps. The preformed part 19 is held against the web 4 of the U-shaped member by the screws 24, 25. A depression 33 is provided in the underside 32 or contact surface, respectively, of the preformed part 19. A portion of the circumferential surface of the ball bearing 6 of the upper rollers 15 of the associated pair of rollers 14, 15 (see FIGS. 2 and 3) comes to rest in the depression 33 when the device 1 is in the pressure position, in order to ensure that the ball bearing is positioned firmly.

Figure 6C:
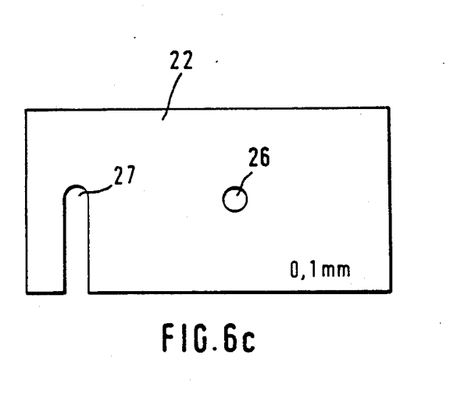

FIGS. 6b and 6c, representing plan views of the preformed part 19 and an intermediate sheet 22, show the tapped holes 28, 29, the depression 33, the enclosed hole 26 and the hole 27 which is open toward the narrow side of the intermediate sheet 22. The intermediate sheets 22 of the stock 23 are also held by the two threaded screws 24, 25.

The hole 27, which is open toward one side, is provided in the intermediate sheet 22 for receiving the screw 25. The enclosed hole 26 is provided in the intermediate sheet 22 for receiving the other screw 24.

One of the screws 25 is secured during the setting of the contact pressure, for example, by a Seeger circlip ring, so that it cannot be lost. The other screw 24 is removed from the preformed part 19 for varying the contact pressure by varying the number of inserted intermediate sheets 22.

After the screw 25 is unscrewed, the intermediate sheets 22 are removed, in the engaged position, at each end surface of the upper rollers 15 which is to be adjusted. Then as many intermediate sheets 22 as can be inserted without exerting any substantial pressure are inserted. The sheets 22 are inserted close to the end surface of the two rollers, between the respective shaped part 19 and the upper web 4, without it being necessary to use a measuring instrument for determining the contact pressure. Thereafter, the slide members are moved to the relieved position, and intermediate sheets 22 from the stock 23 are added to the intermediate sheets 22 already present between the respective preformed part 19 and the upper web 4, until the required roller pressure is reached.

Finally, the screw 24 is reinserted and tightened together with the secured screw 25, so that all parts, i.e., the intermediate sheets and the shaped part, are firmly connected with the web 4.

The roller pressure required for the individual pairs of rollers can be stamped on the webs of the slide members as basic measures. The individual steps required for setting the contact pressure are performed in an identical manner on both sides of each pair of rollers, i.e., the two slide members must be pressed-on or relieved simultaneously.

What is claimed is:

1. A device for engaging and disengaging horizontally-arranged pairs of rollers for transporting sheet-like materials in a transport direction, comprising:
   a plurality of first, horizontal, rollers having first and second axial ends;
   first and second bearings for rotatingly supporting each of the first and second axial ends;
   first and second side plates for supporting the plurality of first rollers;
   a plurality of second, horizontal rollers rotatingly supported in the side plates, wherein said first rollers are arranged to move between a first position engaging the second rollers and a second position not engaging the second rollers;
   a vertical guide corresponding to each bearing for vertically guiding the bearing, and disposed in one of the side walls;
   first and second slide members corresponding to the first and second axial ends, wherein the slide members include an upper web, a lower web and a wall, wherein the slide members are slidably supported on the side walls;
   a first recess disposed in one of the lower web and the upper web corresponding to each of the first and second axial ends;
   a second recess disposed in the other of the lower web and the upper web corresponding to each of the first and second axial ends, wherein each first recess is separated from a corresponding second recess by a first axial distance; and
   means for sliding the sliding member between a third position wherein the bearings are disposed in the first recesses and the first rollers are in the first position, and a fourth position wherein the bearings are disposed in the second recesses and the first rollers are in the second position.

2. A device according to claim 1, further comprising a plurality of friction bearings for slidably containing said sliding members, wherein each of the friction bearings is attached to one of said first and second side plates.

3. A device according to claim 1, wherein said vertical guide comprises a bracket-type guide fixed to one of said first and second side plates.

4. A device according to claim 1, wherein the first rollers comprise upper rollers, the second rollers comprise lower rollers, the first recess comprises a lower recess disposed in the lower web, and the second recess comprises an upper recess disposed in the upper web.

5. A device according to claim 4, wherein said lower recess comprises a first bevelled edge for facilitating a respective bearing to move from a lower recess to an upper recess.

6. A device according to claim 5, wherein said first bevelled edge faces a direction opposite said transport direction, wherein said upper recess comprises a second bevelled edge for facilitating a respective bearing to move from said upper recess to a lower recess, wherein the second bevelled edge faces said direction of transport.

7. A device according to claim 6, wherein said second bevelled edge engages a respective bearing when the sliding member is in said third position and the bearing projects into the lower recess, and wherein said first bevelled edge engages a respective bearing when the sliding member is in said fourth position and the bearing projects into the upper recess.

8. A device according to claim 1, where said means for sliding comprise a gear rack disposed on one of said upper and lower webs and at a first end of said sliding member, a gear wheel segment engaging the gear rack, a shaft for rotatingly supporting the gear wheel segment on one of said first and second side plates, and means for turning the gear wheel segment.

9. A device according to claim 6, wherein said means for turning comprises a lever attached to said shaft.

10. A device according to claim 1, further comprising a plurality of friction gears for slidably containing the sliding members comprising a plastic material and disposed on one of the first and second side plates.

11. A device according to claim 1, wherein said sliding member comprises punched and bent sheet metal.

12. A device according to claim 1, wherein said first axial distance is measured from a center of said first recess to a center of a corresponding second recess, and wherein said first axial distance corresponds to an axial distance between said third and fourth positions.

13. A device according to claim 1, wherein the first and second recesses have lengths greater than an external diameter of the ball bearing, and wherein a height of said wall of the sliding members is less than the external diameter of the ball bearing.

14. A device according to claim 1, wherein said bearing comprise lateral ends of said first rollers.

15. A device according to claim 1, further comprising a preformed part having a third bevelled edge, and detachably fastened to one of the upper and lower webs adjacent to each second recess; and a first plurality of intermediate sheets disposed between one of said upper and lower webs and each preformed part.

16. A device according to claim 15, wherein said intermediate sheets comprise different thicknesses in the range between about 0.05 mm and about 1.0 mm.

17. A device according to claim 15, wherein said intermediate sheets comprise a uniform thickness of 0.1 mm each.

18. A device according to claim 15, further comprising a second plurality of intermediate sheets disposed on a side of said web opposite said first plurality of intermediate sheets, and connected with said first plurality of intermediate sheets and said preformed part.

19. A device according to claim 17, wherein each intermediate sheet is provided with a stamped marking indicating its thickness and a pressure exerted by the first rollers against the second rollers when said rollers are in the first position and said sheet is attached to said preformed part.

20. A device according to claim 15, wherein the intermediate sheets comprise stainless steel.

21. A device according to claim 15, wherein said preformed parts comprises first and second tapped bore holes for containing first and second attachment screws; wherein said intermediate sheets comprise a third hole for containing the first screw and aligned with the first hole and a fourth cut-out open to one side, for containing the second screw; and wherein the first, second, and third holes and the fourth cut-out function as means for attaching the intermediate sheets and preformed part to the upper web.

22. A device according to claim 15, wherein an underside of the preformed part comprises a depression for firmly positioning the bearing when the first rollers are in the first position.

* * * * *